(12) United States Patent
Simonis et al.

(10) Patent No.: US 12,032,027 B2
(45) Date of Patent: Jul. 9, 2024

(54) METHOD AND APPARATUS FOR DETERMINING AND FUSING AN AGING STATE TRAJECTORY OF AN ELECTRICAL ENERGY STORAGE UNIT BASED ON STATISTICAL, MODEL-BASED, AND MACHINE-LEARNING METHODS

(71) Applicant: Robert Bosch GmbH, Stuttgart (DE)

(72) Inventors: Christian Simonis, Leonberg (DE); Stefan Schindler, Bietigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 12 days.

(21) Appl. No.: 17/472,441

(22) Filed: Sep. 10, 2021

(65) Prior Publication Data

US 2022/0099742 A1    Mar. 31, 2022

(30) Foreign Application Priority Data

Sep. 29, 2020   (DE) ..................... 10 2020 212 283.0

(51) Int. Cl.
*G01R 31/36*    (2020.01)
*G01R 31/367*   (2019.01)
(Continued)

(52) U.S. Cl.
CPC ......... *G01R 31/367* (2019.01); *G01R 31/392* (2019.01); *H02J 7/005* (2020.01); *H02J 7/0069* (2020.01)

(58) Field of Classification Search
CPC ..... G01R 31/367; G01R 31/392; H02J 7/005; H02J 7/0069
See application file for complete search history.

(56) References Cited

U.S. PATENT DOCUMENTS 8,332,342 B1 * 12/2012 Saha .................... G01R 31/392
706/45
2014/0372055 A1 * 12/2014 Wang ................... G01R 31/389
702/63

(Continued)

FOREIGN PATENT DOCUMENTS

| CN | 108304685 A * | 7/2018 | ............. G16Z 99/00 |
| CN | 109061520 B * | 4/2021 | ........... G01R 31/378 |
| WO | 2019/057871 A1 | 3/2019 | |

OTHER PUBLICATIONS

Robust prognostics for state of health estimation of lithium-ion batteries based on an improved PSO-SVR model, Science Direct, Microelectronics Reliability, Taichun Qin, School of Reliability and Systems Engineering, Beihang University, Beijing, China. (Year: 2015).*

(Continued)

*Primary Examiner* — Catherine T. Rastovski
*Assistant Examiner* — Lal C Mang
(74) *Attorney, Agent, or Firm* — Maginot, Moore & Beck LLP

(57) ABSTRACT

A method for determining a trajectory function to represent an aging state trajectory for at least one electrical energy storage unit of one or more devices includes determining uncertainty-containing model values of aging states of the at least one electrical energy storage unit, cleaning error-containing model values of the determined uncertainty-containing model values, determining the aging state trajectory based on the cleaned model values, and determining the trajectory function based on the determined aging state trajectory.

19 Claims, 4 Drawing Sheets

(51) Int. Cl.
  *G01R 31/392* (2019.01)
  *H02J 7/00* (2006.01)

(56) References Cited

U.S. PATENT DOCUMENTS

2019/0188592 A1* 6/2019 Berntorp ............. G05B 13/048
2020/0191876 A1  6/2020 Shin et al.

OTHER PUBLICATIONS

State of Health Estimation for Lithium-Ion battery by combing incremental capacity analysis with Gaussian process regression, Xiaoyu Li, National Engineering Laboratory for Electric Vehicles, School of Mechanical Engineering, Beijing Institute of Technology, Beijing, China. (Year: 2019).*

Time Series Data Cleaning with Regular and Irregular Time Intervals (Technical Report), Xi Wang, School of Software, Tsingua University, Beijing, China (Year: 2020).*

Moving Average Filter: Towards Signal Noise Reduction; Codemonk, Abhishek C.V. Salian, Moving Average Filter: Towards Signal Noise Reduction (Year: 2022).*

Qin, T et al., "Robust prognostics for state of health estimation of lithium-ion batteries based on an improved PSO-SVR model," Microelectronics Reliability, 2015 (3 pages).

Wang, X. et al., "Time Series Data Cleaning with Regular and Irregular Time Intervals (Technical Report)," In: arXiv:2004.08284, Jun. 2020 (17 pages).

Li, X. et al., "State of health estimation for lithium-ion battery by combining incremental capacity analysis with Gaussian process regression," In: arXiv:1903.7672, 2019 (25 pages).

* cited by examiner

METHOD AND APPARATUS FOR DETERMINING AND FUSING AN AGING STATE TRAJECTORY OF AN ELECTRICAL ENERGY STORAGE UNIT BASED ON STATISTICAL, MODEL-BASED, AND MACHINE-LEARNING METHODS

This application claims priority under 35 U.S.C. § 119 to patent application no. DE 10 2020 212 283.0, filed on Sep. 29, 2020 in Germany, the disclosure of which is incorporated herein by reference in its entirety.

The disclosure relates to the model-based determination of aging states of electrical energy storage units, and in particular to a cloud-based determination of an aging state trajectory for identical electrical energy storage units.

BACKGROUND

The energy supply of electrical devices and machines operated independently of the grid, such as electrically powered motor vehicles, is effected by means of electrical energy storage units, usually portable batteries or vehicle batteries. These provide electrical energy for the operation of the devices. In this document, energy storage devices also includes fuel cells.

The aging state of an energy storage device, i.e. a figure indicating a measure of the aging of the energy storage unit, changes rapidly over its lifetime, which results in a decreasing maximum storage capacity and loading capacity. A measure of the aging of the energy storage unit depends on the individual loading on the energy storage unit, i.e. in the case of vehicle batteries of motor vehicles, on the behavior of a driver, external environmental conditions, and the vehicle battery type.

Although a physical aging state model can be used to determine the current aging state of the energy storage unit based on historical operating state trajectories, this model is inaccurate in certain situations. This inaccuracy of the conventional aging state model makes it difficult to determine and predict the aging state trajectory over the lifetime of the energy storage unit. However, the prediction of the trajectory of the aging state of the energy storage unit is an important technical parameter, as it enables an economic evaluation of the residual value of the energy storage unit.

The temporal profile of an aging state of an electrical energy storage unit is considerably nonlinear. Thus, a prediction of an aging state for a specific energy storage unit is not easily possible by extrapolating the model values of the aging state.

SUMMARY

According to the disclosure, a method for determining an aging state trajectory for an electrical energy storage unit based on uncertainty-containing model values of the aging state as well as a corresponding apparatus are provided.

According to a first aspect, a computer-implemented method is provided for determining a trajectory function for representing an aging state trajectory for electrical energy storage units, having the following steps:
 providing uncertainty-containing model values of aging states of one or more electrical energy storage units,
 cleaning the error-containing model values;
 determine an aging state trajectory based on the set of cleaned model values of the aging state.

Methods based on current or short-term measurements are not suitable for the precise determination of an aging state of electrical energy storage units, due to measurement inaccuracies and undetectable effects. In addition, predicting the development of an aging state of electrical energy storage units normally requires extrapolation methods to be used. However, due to the nonlinear progression of the aging state over time, these are not exactly predictable. However, for the operation of a machine operated with the energy storage unit, such as for planning a replacement of an energy storage unit or for determining and signaling the end of a service life of the energy storage unit, it is necessary to be able to make an exact prediction of the trajectory of the aging state of electrical energy storage devices.

Furthermore, an accurate life expectancy forecast enables the determination of the expected future development of the residual value and the pre-emptive detection of age-critical operating states of the energy storage unit.

The uncertainty-containing model values can be determined by applying a data-based aging state model that is designed to indicate a state uncertainty for each model value. The aging state model can be based on physical or data-driven methods, or have a hybrid architecture of a combination of a physical aging state model with a data-based correction model. Often, however, data-based aging models are not trained with sufficient accuracy for all operating ranges, so that the state uncertainty of the model prediction considerably complicates the prediction of the aging state trajectory.

Provision is therefore made to determine, on the basis of a data-based aging state model, an aging state trajectory which is corrected for errors and which indicates as precisely as possible the trajectory of the actual aging state and a predictive trajectory of the aging state, in particular under the same loading factors. For this purpose, measurements of aging states of the energy storage units to be characterized are used to determine the model values of a predefined aging state model and the associated state uncertainties.

The model values can be determined, for example, by using probabilistic regression models, e.g. a Gaussian process model, or point estimator models. The model prediction in these models is carried out in conjunction with the prediction of the state uncertainty, which is one of the prerequisites for the application of the method presented here. In particular, empirical models can also be used to observe the SOH-C and SOH-R, e.g. based on the analysis of the charge and/or discharge phases of the battery usage. An SOH-C estimate is preferably formed by Coulomb counting or a current integral, which is divided by the SOC swing. SOH-R values can be calculated by means of voltage changes divided by a current change. These are usually based on a defined time interval.

It may be provided that the cleaning of the error-containing model values comprises a trend correction.

Furthermore, cleaning the error-containing model values can comprise eliminating model values that fall outside a specified n σ-confidence interval.

Alternatively, the cleaning of the error-containing model values can be performed using an unsupervised machine learning method for isolating anomalies, in order to eliminate model values that are detected as outliers.

It can be provided that the cleaned model values are smoothed according to their similarity to adjacent model values, in particular by means of a median filter or by means of a control-engineering observer concept, such as a Kalman filter or a Luenberger observer.

In this way, outliers can be eliminated from a given time series of modeled aging states via a suitable cleaning procedure and deviations can be reduced by means of a smoothing procedure based on the application of domain knowledge.

Furthermore, the aging state trajectory can be determined by fitting the cleaned and smoothed model values of the aging state to a parameterizable trajectory function. Accordingly, an aging state trajectory can be determined from the cleaned model values, which can be implemented, for example, in the form of a parameterizable trajectory function, such as a (piecewise) linear model, a polynomial function or the like.

This enables a precise aging state trajectory to be determined, also based on a time series of uncertainty-containing model values of the aging state, in particular from a data-based aging state model.

The method can be executed repeatedly, wherein the cleaning of the error-containing model values always takes into account all the model values provided during the lifetime of the energy storage units.

The method can also be executed in a central unit which is external to the device (cloud) and connected to the devices.

In addition, the energy storage units can be used for operating a device such as a motor vehicle, an electrically assisted bicycle, an aircraft, in particular a drone, a machine tool, a consumer electronics device such as a mobile phone, an autonomous robot, and/or a household appliance.

According to one embodiment a state uncertainty of at least one of the model values can be reduced by the law of large numbers, in order to reduce the resulting uncertainty of the aging state trajectory by smoothing.

According to a further aspect, an apparatus is provided for determining a trajectory function for representing an aging state trajectory for electrical energy storage units, wherein the apparatus is designed for:
  providing uncertainty-containing model values of aging states of one or more electrical energy storage units,
  cleaning the error-containing model values;
  determining an aging state trajectory based on the set of cleaned model values of the aging state.

BRIEF DESCRIPTION OF THE DRAWINGS

Embodiments are explained below with reference to the attached drawings. In the drawings.

DETAILED DESCRIPTION

Figure 1:
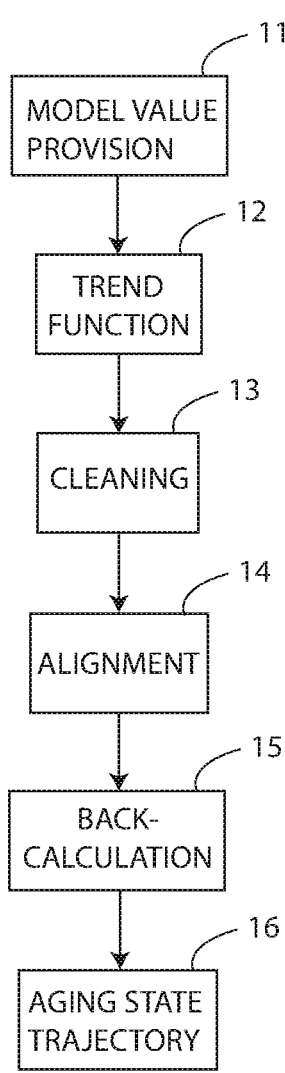
FIG. 1 shows a schematic block diagram of the function for determining an aging state trajectory.
Figure 2:
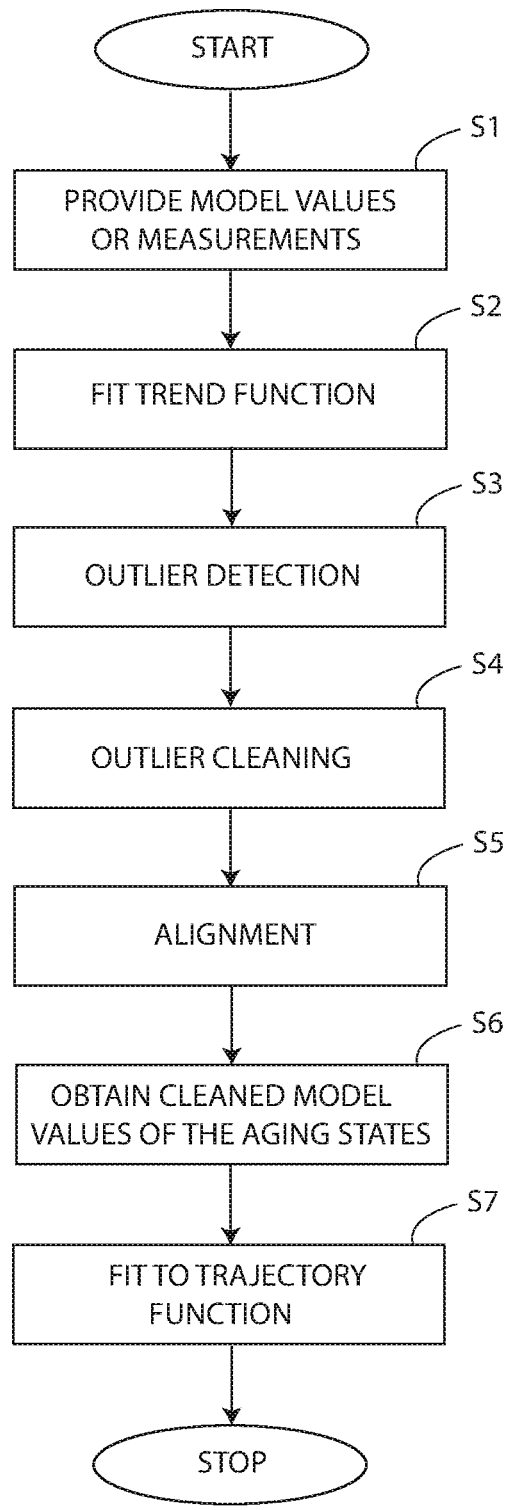
FIG. 2 shows a flowchart illustrating a method for determining a cleaned aging state trajectory.

FIG. 1 shows a schematic block diagram of a function for creating an aging state trajectory in the form of a trajectory function. The function for creating the aging state trajectory is described in more detail in conjunction with the flowchart of FIG. 2. The aging state trajectory indicates the aging of an electrical energy storage unit over time. In the following, a plurality of identical batteries from battery-operated devices or machines are assumed as electrical energy storage units. The method can be implemented in a central unit that is in communication with one or more battery-powered devices or machines.

In a model value provision block 11, in step S1 model values or measurements of the aging state are provided for different points in time during the lifetime of a specific battery or a plurality of batteries. The model values can be obtained by evaluating a data-based aging state model of one or more batteries. For this purpose, specific sections of the battery data provided to the model value provision block are evaluated based on battery domain knowledge, and the state of life is determined, for example, by Coulomb counting and SOC differentiation. The model value provision block is evaluated with battery data at different times throughout the battery life sufficiently often that the series of model values generated corresponds to the required data range, for example up to the current state of life. Furthermore, by using multiple observations, by the law of large numbers the resulting uncertainty of the trajectory can be reduced and statistically quantified.

Figure 3:
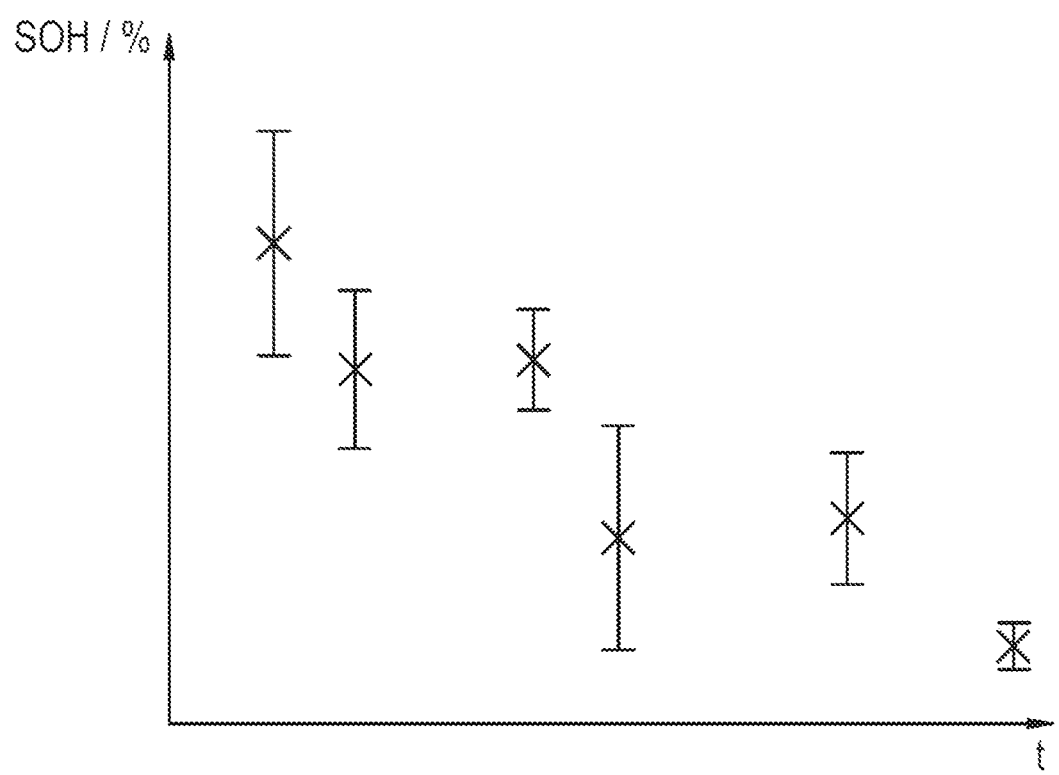
FIG. 3 shows a predefined time series of model values of an aging state.

As an example, a temporal profile of the model values SOH (crosses) of the aging state, and the state uncertainties of the model values of the aging state, are shown in FIG. 3.

Figure 4:
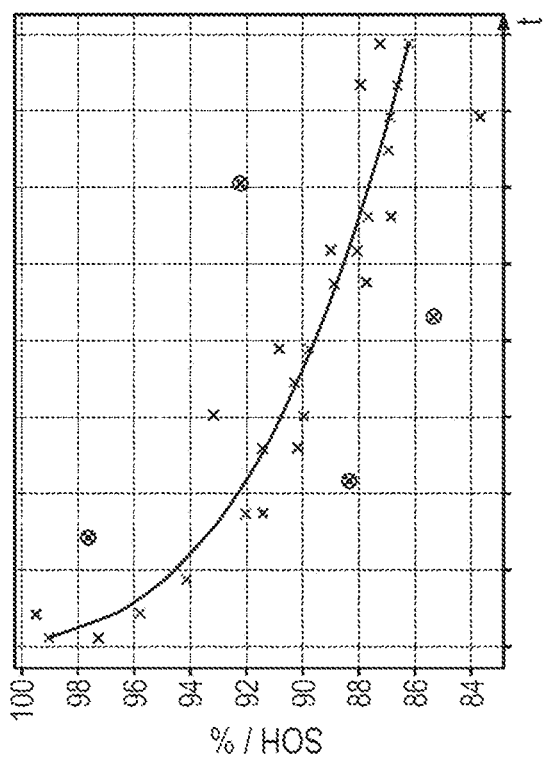
FIG. 4 shows a trend function through the specified time series of aging states.

In a trend function block 12, in step S2, as shown in FIG. 4, a trend function is fitted over the data points (represented as x) of the time series of the aging states. This can be carried out using a method for minimizing the weighted least squares according to a quality function. The quality function can take into account the state uncertainties of the aging states of the time series in the form of a weighting. The quality function can, for example, correspond to the following function:

$$S = \sum_i \omega_i (y_i - f(x_i, \beta))^2$$

where $\omega_i$ is the weighting of the value i proportional to the inverse standard deviation $\sigma_i$ of the relevant model value. Thus, the weightings $\omega_i$ are inversely proportional to the confidence values (standard deviations) of the model values of the aging state model. $y_i$ corresponds to the model value of the aging state initially provided, while $f$ corresponds to the parameterizable trend function with the function parameters $\beta$ to be determined. $x_i$ corresponds to the fitting values associated with the model values $y_i$, for example, to the times of the model values relative to the time of commissioning of the energy storage unit. However, the fitting values $x_i$ can also include other usage variables, e.g. the energy throughput since commissioning.

By minimizing the quality function S based on the provided model values of the aging states, a trend function of the aging state can be determined.

The trend function is a parameterizable function, such as a polynomial function or a (piecewise) linear function, a data-driven model function or the like, the parameters of which are determined by minimizing the quality function.

Figure 5:
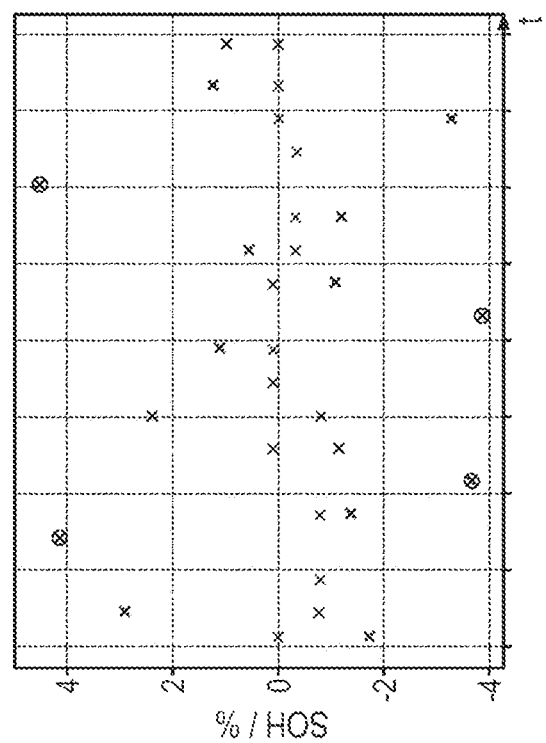
FIG. 5 shows data points after a trend subtraction and outlier cleaning.

For outlier detection, in a subsequent step S3, the trend function is subtracted from the model values of the aging state in order to obtain a distribution of the trend-corrected model values, as shown with crosses in FIG. 5.

The outlier cleaning can be carried out in a cleaning block 13 by removing all model values outside a specified n σ-confidence interval in step S4. These are represented by circles. In each model invocation in the central unit, all model values since the start of the service life are reevaluated with regard to outliers. This means that an observation previously classified as an "outlier" and temporarily discarded can be evaluated as valid in a later repeated evaluation and is not discarded again. All model values since the start of the service life are thus stored in the central unit and are always available for a fresh execution of the algorithm.

Alternatively, an unsupervised clustering method can be used for isolating anomalies in order to identify and remove outlier model values.

Then, in step S5, in an alignment block 14, the outlier-corrected model values are smoothed according to their similarity to adjacent model values, e.g. via median filters of width m. The function of the median filter is to cycle through the model values one by one and replace each of the model values with the median of the adjacent entries.

As an alternative to statistical fusion, the fusion can be model-based using observer concepts from control engineering, such as Kalman filters, Luenberger observers and the like, wherein the model function of the observer is selected according to the set trend function $f$.

The purpose of step S5 is to apply domain knowledge, namely that the aging state is essentially steady and monotonic.

Figure 6:
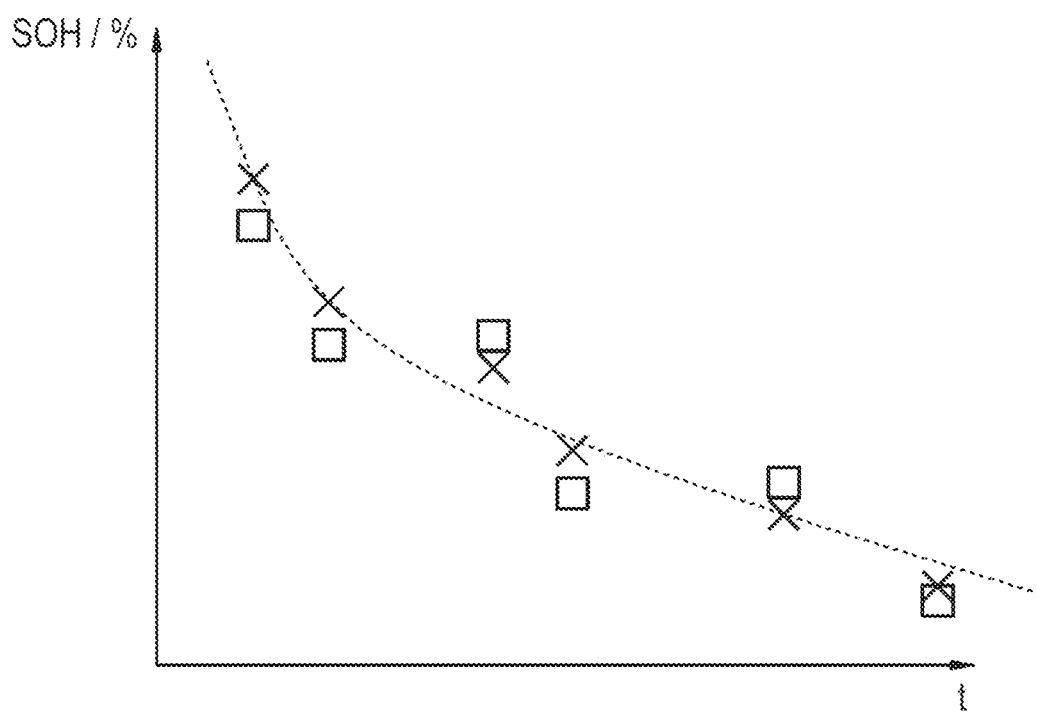
FIG. 6 shows a trajectory function with original model values and cleaned model values.

The outlier-corrected smoothed model values are then added to the previously determined trend function again in a back-calculation block 15 in step S6, in order to obtain cleaned model values (crosses) of the aging states. This is shown in FIG. 6. The squares show the original model values, while the crosses represent the cleaned and smoothed model values.

In step S7, these are now fitted to a trajectory function in a trajectory block 16 (see curve of FIG. 6), which can preferably have a parameterizable form, in particular the parameterizable form of the trend function, such as a polynomial function.

The result is a usable trajectory function for predicting aging state trajectory, which is cleaned in a particularly reliable way by taking account of the model uncertainties of the aging state model and by using domain knowledge. This aging state trajectory can subsequently be used to perform aging state prediction of measured aging states of energy storage units.

The above method makes it possible to combine aging state calculations with different state uncertainties and to merge them into a resultant trajectory calculation since the time of commissioning. Based on an aging state trajectory generated in this way, a highly accurate prediction of the aging state can be enabled.

What is claimed is:

1. A method for determining a trajectory function to represent an aging state trajectory for at least one electrical energy storage unit of one or more devices, comprising:
   determining a plurality of uncertainty-containing model values of aging states of the at least one electrical energy storage unit by applying an aging state model;
   determining a state uncertainty value for each of the determined model values of the plurality of uncertainty-containing model values using the aging state model;
   determining error-containing model values of the determined plurality of uncertainty-containing model values;
   cleaning the determined plurality of uncertainty-containing model values based on the determined error-containing model values and the corresponding state uncertainty values to determine a plurality of cleaned model values, in which some of the model values of the plurality of uncertainty-containing are eliminated from the plurality of uncertainty-containing model values;
   storing the eliminated model values in a central unit;
   determining the aging state trajectory based on the determined plurality of cleaned model values and the determined plurality of uncertainty-containing model values;
   determining the trajectory function based on the determined aging state trajectory;
   determining a residual lifetime of the at least one energy storage unit based on the determined trajectory function; and
   executing the method repeatedly,
   wherein the cleaning of the determined plurality of uncertainty-containing model values is always based on all of the uncertainty-containing model values of the determined plurality of uncertainty-containing model values of aging states of the at least one electrical energy storage unit including the eliminated model values stored in the central unit.

2. The method according to claim 1, further comprising:
   determining the plurality of uncertainty-containing model values by applying a data-based aging state model; and
   determining the state uncertainty values by applying the data-based aging state model.

3. The method according to claim 1, wherein the cleaning of the determined plurality of uncertainty-containing model values comprises a trend correction.

4. The method according to claim 1, wherein the cleaning of the determined plurality of uncertainty-containing model values comprises:
   eliminating the uncertainty-containing model values that lie outside a specified n a-confidence interval.

5. The method according to claim 1, wherein the cleaning of the determined plurality of uncertainty-containing model values comprises:
   isolating anomalies using an unsupervised clustering method in order to eliminate uncertainty-containing model values that are recognized as outliers.

6. The method according to claim 4, further comprising:
   determining a plurality of smoothed model values by smoothing the determined plurality of cleaned model values according to their similarity to adjacent uncertainty-containing model values using at least one of a median filter and a control-engineering observer concept, including a Kalman filter or Luenberger observer.

7. The method according to claim 6, further comprising:
   determining the aging state trajectory by fitting the determined plurality of cleaned model-values, the determined plurality of smoothed model values, and the determined plurality of uncertainty-containing model values to the trajectory function,
   wherein the trajectory function is a parameterizable trajectory function.

8. The method according to claim 1, wherein the central unit is external to the one or more devices.

9. The method according to claim 1, wherein the one or more devices includes a motor vehicle, an electrically assisted bicycle, an aircraft, a drone, a machine tool, a consumer electronics device, a mobile phone, an autonomous robot, and/or a household appliance.

10. The method according to claim 1, further comprising:
    reducing the state uncertainty of at least one uncertainty-containing model value of the determined plurality of uncertainty-containing model values by the law of large numbers in order to reduce a resulting uncertainty of the aging state trajectory by smoothing.

11. The method according to claim 1, wherein a computer program comprises commands which, during execution of the computer program by least one data processing device, causes the at least one data processing device to execute the method.

12. The method according to claim 11, wherein the computer program is stored on a non-transitory computer-readable storage medium.

13. An apparatus for determining a trajectory function for representing an aging state trajectory for at least one electrical energy storage unit, comprising:
a device configured to:
determine a plurality of uncertainty-containing model values of aging states of the at least one electrical energy storage unit by applying an aging state model;
determining a state uncertainty value for each of the determined model values of the plurality of uncertainty-containing model values using the aging state model;
determine error-containing model values of the determined plurality of uncertainty-containing model values;
clean the determined plurality of uncertainty-containing model values based on the determined error-containing model values and the corresponding state uncertainty values to determine a plurality of cleaned model values, in which some of the model values of the plurality of uncertainty-containing are eliminated from the plurality of uncertainty-containing model values;
store the eliminated model values in a central unit;
determine the aging state trajectory based on the determined plurality of cleaned model values and the determined plurality of uncertainty-containing model values;
determine the trajectory function based on the determined aging state trajectory;
determining a residual lifetime of the at least one energy storage unit based on the determined trajectory function; and
executing the method repeatedly,
wherein the cleaning of the determined plurality of uncertainty-containing model values is always based on all of the uncertainty-containing model values of the determined plurality of uncertainty-containing model values of aging states of the at least one electrical energy storage unit including the eliminated model values stored in the central unit.

14. The method according to claim 1, wherein the cleaning of the determined plurality of uncertainty-containing model values comprises:
fitting a trend function over the determined plurality of uncertainty-containing model values to determine trend-corrected model values,
wherein the trend function corresponds to a method for minimizing a weighted least squares of the determined plurality of uncertainty-containing model values according to a quality function, and
wherein the quality function is based on the state uncertainty values of the uncertainty-containing model values of the at least one electrical energy storage unit in the form of a weighting, and
wherein the aging state trajectory is determined based on the determined trend-corrected model values.

15. The method according to claim 1, further comprising:
using the determined trajectory function to determine a current aging state of the at least one electrical energy storage unit.

16. The method according to claim 14, wherein the trend function is determined by minimizing the quality function based on the model values of the plurality of uncertainty-containing model values.

17. The method according to claim 6, wherein:
the cleaning of the determined plurality of uncertainty-containing model values comprises fitting a trend function over the determined plurality of uncertainty-containing model values to determine trend-corrected model values,
the trend function corresponds to a method for minimizing a weighted least squares of the determined plurality of uncertainty-containing model values according to a quality function,
the quality function is based on the state uncertainty values of the uncertainty-containing model values of the at least one electrical energy storage unit in the form of a weighting, and
determining the plurality of cleaned model values comprises adding the smoothed model values to the trend function in a back-calculation block.

18. The method according to claim 17, wherein:
the quality function is the following function $$S = \sum_i \omega_i (y_i - f(x_i, \beta))^2$$

$\omega_i$ is a weighting average of the value i proportional to an inverse standard deviation $\sigma_i$ of a corresponding model value,
$y_i$ is a model value of the aging state initially provided,
$f$ is the parameterizable trend function with function parameters $\beta$, and
$x_i$ is fitting values associated with model values $y_i$.

19. The method according to claim 1, wherein:
an eliminated model value stored in the central unit is later evaluated as being valid and is included in the determined plurality of cleaned model values.

* * * * *

UNITED STATES PATENT AND TRADEMARK OFFICE
CERTIFICATE OF CORRECTION

PATENT NO. : 12,032,027 B2
APPLICATION NO. : 17/472441
DATED : July 9, 2024
INVENTOR(S) : Simonis et al.

It is certified that error appears in the above-identified patent and that said Letters Patent is hereby corrected as shown below:

In the Claims

In Claim 4, at Column 6, Line 35: "a specified n a-confidence interval." should read -- a specified σ-confidence interval. --.

In Claim 18, at Column 8, Line 42: the equation "$S = \sum_i \omega_i (y_i - f(x_i, \beta)^2$" should read -- $S = \sum_i \omega_i (y_i - f(x_i, \beta)^2)$ --.

Signed and Sealed this
Fourth Day of February, 2025

Coke Morgan Stewart
*Acting Director of the United States Patent and Trademark Office*